United States Patent
Choi et al.

(10) Patent No.: US 9,947,457 B2
(45) Date of Patent: *Apr. 17, 2018

(54) PRE SPACE TRANSFORMER, SPACE TRANSFORMER MANUFACTURED USING THE PRE SPACE TRANSFORMER, AND SEMICONDUCTOR DEVICE INSPECTING APPARATUS INCLUDING THE SPACE TRANSFORMER

(71) Applicant: SEMCNS CO., LTD., Seongnam-si, Gyeonggi-do (KR)

(72) Inventors: Yoon Hyuck Choi, Suwon-si (KR); Kwang Jae Oh, Suwon-si (KR); Ki Young Kim, Suwon-si (KR)

(73) Assignee: SEMCNS CO., LTD., Seongnam-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/443,653

(22) Filed: Feb. 27, 2017

(65) Prior Publication Data

US 2017/0169931 A1 Jun. 15, 2017

Related U.S. Application Data

(63) Continuation of application No. 14/029,684, filed on Sep. 17, 2013.

(30) Foreign Application Priority Data

Dec. 21, 2012 (KR) .................. 10-2012-0150877

(51) Int. Cl.
*H01F 27/28* (2006.01)
*G01R 1/073* (2006.01)
(Continued)

(52) U.S. Cl.
CPC ..... *H01F 27/2804* (2013.01); *G01R 1/07378* (2013.01); *G01R 31/2889* (2013.01); *H01F 27/29* (2013.01)

(58) Field of Classification Search
CPC . H01F 27/2804; H01F 27/29; G01R 31/2889; G01R 1/07378
See application file for complete search history.

(56) References Cited

U.S. PATENT DOCUMENTS 5,904,487 A 5/1999 Conboy et al.
7,252,514 B2 * 8/2007 McKnight ............ H01R 9/0515
439/66

(Continued)

FOREIGN PATENT DOCUMENTS

EP 0180013 A1 5/1986
JP 10-2001-326293 A 11/2001
(Continued)

OTHER PUBLICATIONS

Japanese Office Action dated Jul. 7, 2015 issued in Japanese Patent Application No. 2013-226576 (English translation).
(Continued)

*Primary Examiner* — Minh Phan
*Assistant Examiner* — Zannatul Ferdous
(74) *Attorney, Agent, or Firm* — McDermott Will & Emery LLP

(57) ABSTRACT

Disclosed herein is a pre space transformer including: a substrate having a first surface and a second surface, which is an opposite surface to the first surface; individual electrodes disposed on the first surface; and common electrodes disposed in the substrate, wherein the individual electrodes are repeatedly disposed while configuring a unit pattern.

6 Claims, 3 Drawing Sheets

(51) Int. Cl.
*G01R 31/28* (2006.01)
*H01F 27/29* (2006.01)

(56) References Cited

U.S. PATENT DOCUMENTS

| | | | |
|---|---|---|---|
| 2005/0061545 | A1 | 3/2005 | Rosenau et al. |
| 2007/0290705 | A1 | 12/2007 | Eldridge et al. |
| 2009/0184727 | A1* | 7/2009 | Kim .................. G01R 1/07378 324/754.07 |
| 2009/0211793 | A1* | 8/2009 | Nakano .................. H01L 24/03 174/260 |
| 2010/0244871 | A1* | 9/2010 | Blair .................. G01R 1/07378 324/756.05 |
| 2011/0063066 | A1 | 3/2011 | Choi et al. |
| 2011/0257532 | A1 | 10/2011 | Sasaki |
| 2012/0017428 | A1 | 1/2012 | Hsu et al. |
| 2012/0169367 | A1 | 7/2012 | Kuo et al. |

FOREIGN PATENT DOCUMENTS

| | | |
|---|---|---|
| JP | 2008102145 A | 5/2008 |
| JP | 2009-541715 A | 11/2009 |
| JP | 2010054323 A | 3/2010 |
| KR | 10-2004-0104706 A | 12/2004 |
| KR | 10-2008-0005288 A | 1/2008 |
| KR | 10-2010-0005904 A | 1/2010 |
| KR | 10-2011-0004635 A | 1/2011 |
| KR | 10-2011-0020098 A | 3/2011 |
| KR | 10-2011-0023343 A | 3/2011 |
| KR | 10-1048497 B1 | 7/2011 |

OTHER PUBLICATIONS

JP 2013-226576 Office Action dated Sep. 30, 2014, 4 pgs.
KR 10-2012-0150877 Notice of Allowance dated Jul. 7, 2014, 2 pgs.
Non-final Office Action issued in U.S. Appl. No. 14/029,684 dated Feb. 27, 2015.
Non-final Office Action issued in U.S. Appl. No. 14/029,684 dated Aug. 10, 2015.
Final Office Action issued in U.S. Appl. No. 14/029,684 dated Dec. 31, 2015.
Non-final Office Action issued in U.S. Appl. No. 14/029,684 dated Apr. 21, 2016.
Final Office Action issued in U.S. Appl. No. 14/029,684 dated Aug. 10, 2016.
Notice of Allowance issued in U.S. Appl. No. 14/029,684 dated Feb. 27, 2017.

* cited by examiner

[FIG. 1]
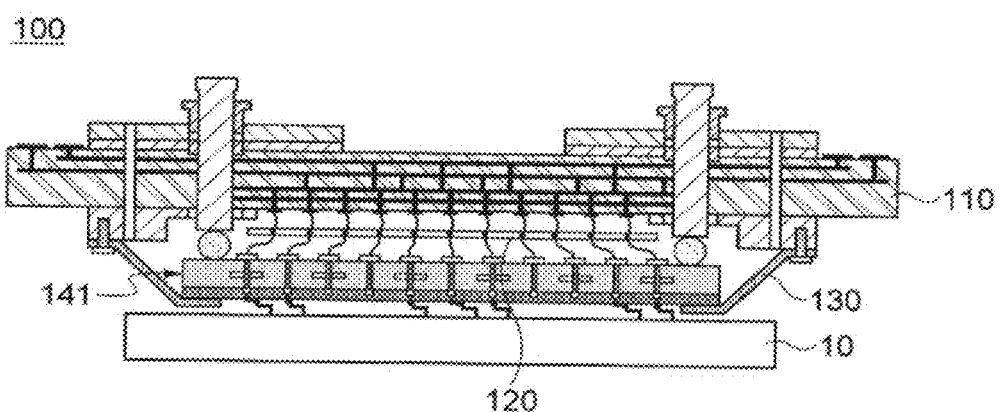
[FIG. 2]
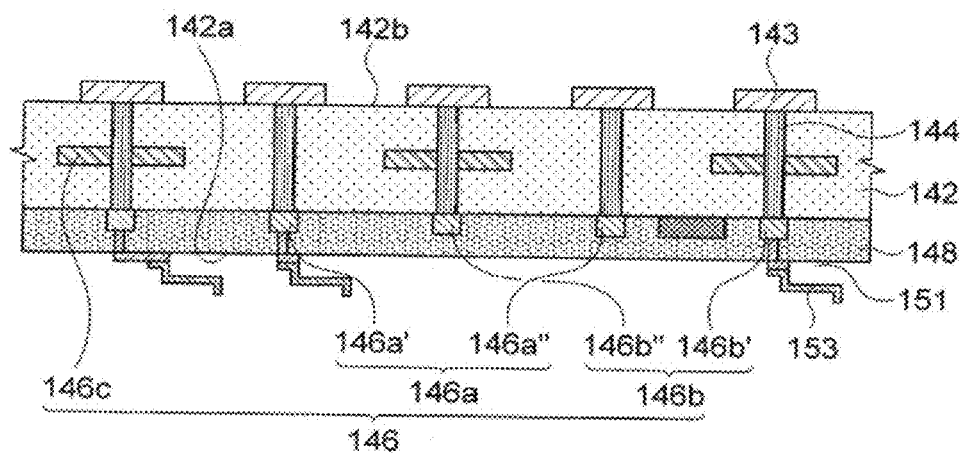

[FIG. 3]
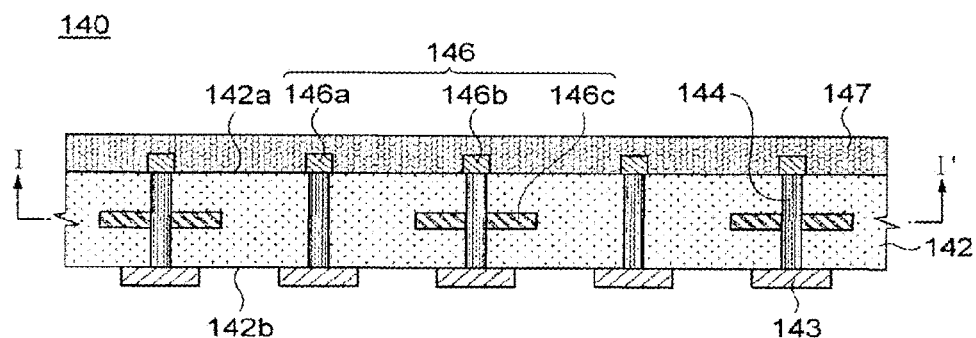
[FIG. 4]
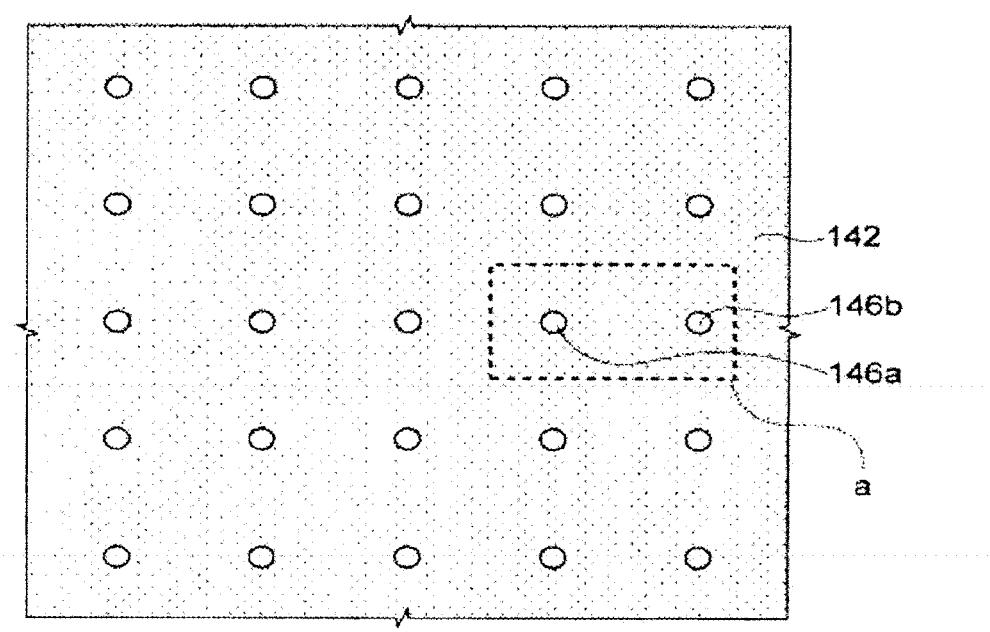

[FIG. 5]
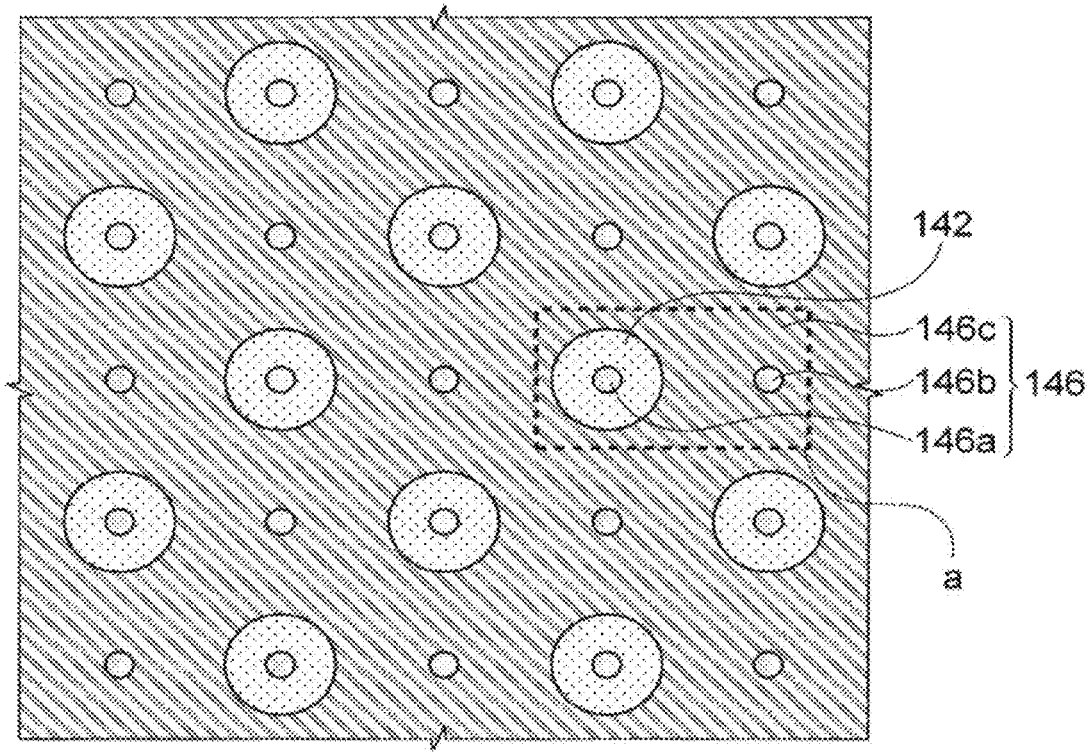

PRE SPACE TRANSFORMER, SPACE TRANSFORMER MANUFACTURED USING THE PRE SPACE TRANSFORMER, AND SEMICONDUCTOR DEVICE INSPECTING APPARATUS INCLUDING THE SPACE TRANSFORMER

CROSS REFERENCE(S) TO RELATED APPLICATIONS

This application is a Continuation Application of U.S. patent application Ser. No. 14/029,684 filed on Sep. 17, 2013, which claims the benefit under 35 U.S.C. Section 119 of Korean Patent Application Serial No. 10-2012-0150877, entitled "Pre Space Transformer, Space Transformer Manufactured Using the Pre Space Transformer, and Semiconductor Device Inspecting Apparatus Including the Space Transformer" filed on Dec. 21, 2012, which is hereby incorporated by reference in its entirety into this application.

BACKGROUND OF THE INVENTION

1. Technical Field

The present invention relates to a pre space transformer, a space transformer manufactured using the pre space transformer, and semiconductor device inspecting apparatus including the space transformer, and more particularly, to a pre space transformer capable of simplifying a structure of a space transformer and increasing manufacturing efficiency thereof, a space transformer manufactured using the pre space transformer, and a semiconductor device inspecting apparatus including the space transformer.

2. Description of the Related Art

As a degree of integration of a semiconductor integrated circuit device has increased, an inspecting apparatus for performing an inspecting process on a semiconductor integrated circuit has also demanded high precision. For example, as a typical semiconductor integrated circuit chip inspecting apparatus, a probe apparatus has been widely used. In order to satisfy an inspecting process for a high integrated semiconductor integrated circuit chip, fine pitch of probe pins connected to the semiconductor integrated circuit chip should be implemented. To this end, a space transformer compensating for a difference between a pitch of the probe pins and a pitch of the semiconductor integrated circuit has been necessarily used.

RELATED ART DOCUMENT

Patent Document (Patent Document 1) Korean Patent No. 10-1046497

SUMMARY OF THE INVENTION

An object of the present invention is to provide a pre space transformer capable of simplifying a structure of a space transformer, a space transformer manufactured using the pre space transformer, and a semiconductor device inspecting apparatus including the space transformer.

Another object of the present invention is to provide a pre space transformer capable of increasing manufacturing efficiency of a space transformer.

Still another object of the present invention is to provide a space transformer of which a manufacturing period may be shortened, and a semiconductor device inspecting apparatus including the space transformer.

According to an exemplary embodiment of the present invention, there is provided a pre space transformer including: a substrate having a first surface and a second surface, which is an opposite surface to the first surface; individual electrodes disposed on the first surface; and common electrodes disposed in the substrate, wherein the individual electrodes are repeatedly disposed while configuring a unit pattern.

The individual electrodes may include signal/power electrodes and ground electrodes disposed so as to be spaced apart from each other on the same plane.

The individual electrodes may include signal/power electrodes and ground electrodes, and the common electrodes may include common ground electrodes electrically connected to the ground electrodes.

The individual electrodes may include signal/power electrodes and ground electrodes having an island-shaped transversal cross section, and the common electrodes may include common ground electrodes having a plate shape.

The unit pattern may be provided in a grid shape in which it includes one signal/power electrode and one ground electrode that are disposed to be spaced apart from each other.

The pre space transformer may further include a protective film covering at least one of the first surface and the second surface.

The pre space transformer may further include a plurality of vias penetrating through the substrate, wherein the vias are disposed to form a grid shape.

The pre space transformer may further include a plurality of vias penetrating through the substrate; and electrode pads connected to the vias on the second surface.

According to another exemplary embodiment of the present invention, there is provided a space transformer compensating for a difference in a circuit pitch between a semiconductor device and a circuit board, the space transformer including: a substrate having a first surface facing the semiconductor device and a second surface facing the circuit board; individual electrodes disposed on the first surface while configuring one unit pattern; common electrodes disposed in the substrate; an insulating pattern covering the first surface so that the individual electrodes are selectively opened; circuit patterns formed to be electrically connected to the individual electrodes on the insulating pattern; and connection pins connected to the circuit patterns to thereby be connected to the semiconductor device.

The individual electrodes may include signal/power electrodes and ground electrodes disposed so as to be spaced apart from each other on the same plane.

The individual electrodes may include signal/power electrodes and ground electrodes, and the common electrodes may include common ground electrodes electrically connected to the ground electrodes.

The individual electrodes may include signal/power electrodes and ground electrodes having an island-shaped transversal cross section, and the common electrodes may include common ground electrodes having a plate shape.

The individual electrodes may include: a used electrode selectively opened by a protective pattern to thereby be electrically connected to the connection pin; and a non-used electrode covered by the protective pattern to thereby not be exposed.

According to still another exemplary embodiment of the present invention, there is provided a semiconductor device inspecting apparatus for inspecting electrical characteristics of a semiconductor device, the semiconductor device inspecting apparatus including: a printed circuit board receiving an inspecting signal transferred from a tester; an interposer disposed at one side of the printed circuit board facing the semiconductor device; and a space transformer receiving the inspecting signal transferred from the interposer to transfer the inspecting signal to the semiconductor device and compensating for a difference in a circuit pitch between the printed circuit board and the semiconductor device, wherein the space transformer includes: a substrate having a first surface facing the semiconductor device and a second surface facing the circuit board; individual electrodes disposed on the first surface while configuring one unit pattern; common electrodes disposed in the substrate; an insulating pattern covering the first surface so that the individual electrodes are selectively opened; circuit patterns formed to be electrically connected to the individual electrodes on the insulating pattern; and connection pins connected to the circuit patterns to thereby be connected to the semiconductor device.

The individual electrodes may include signal/power electrodes and ground electrodes disposed so as to be spaced apart from each other on the same plane.

The individual electrodes may include signal/power electrodes and ground electrodes, and the common electrodes may include common ground electrodes electrically connected to the ground electrodes.

The individual electrodes may include signal/power electrodes and ground electrodes having an island-shaped transversal cross section, and the common electrodes may include common ground electrodes having a plate shape.

The individual electrodes may include: a used electrode selectively opened by a protective pattern to thereby be electrically connected to the connection pin; and a non-used electrode covered by the protective pattern to thereby not be exposed.

BRIEF DESCRIPTION OF THE DRAWINGS

FIG. 1 is a view showing a semiconductor device inspecting apparatus according to an exemplary embodiment of the present invention;

FIG. 2 is a view showing a space transformer shown in FIG. 1;

FIG. 3 is a cross-sectional view showing a pre space transformer for manufacturing the space transformer shown in FIG. 2;

FIG. 4 is a plan view showing the pre space transformer for manufacturing the space transformer shown in FIG. 2; and FIG. 5 is a cross-sectional view taken along the line I-I' of FIG. 2.

DESCRIPTION OF THE PREFERRED EMBODIMENTS

Various advantages and features of the present invention and methods accomplishing thereof will become apparent from the following description of embodiments with reference to the accompanying drawings. However, the present invention may be modified in many different forms and it should not be limited to exemplary embodiments set forth herein. Rather, these embodiments may be provided so that this disclosure will be thorough and complete, and will fully convey the scope of the invention to those skilled in the art. Like reference numerals throughout the specification denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Further, the exemplary embodiments described in the specification will be described with reference to cross-sectional views and/or plan views that are ideal exemplification figures. In the drawings, the thickness of layers and regions is exaggerated for efficient description of technical contents. Therefore, exemplified forms may be changed by manufacturing technologies and/or tolerance. Therefore, the exemplary embodiments of the present invention are not limited to specific forms but may include the change in forms generated according to the manufacturing processes For example, a region vertically shown may be rounded or may have a predetermined curvature.

Hereinafter, a pre space transformer, a space transformer manufactured using the pre space transformer, and a semiconductor device inspecting apparatus including the space transformer according to an exemplary embodiment of the present invention will be described in detail with reference to the accompanying drawings.

FIG. 1 is a view showing a pre space transformer, a space transformer manufactured using the pre space transformer, and a semiconductor device inspecting apparatus including the space transformer according to an exemplary embodiment of the present invention.

Referring to FIGS. 1 and 2, the semiconductor device inspecting apparatus 100 including the space transformer according to the exemplary embodiment of the present invention may be an apparatus for inspecting electrical characteristics of a predetermined semiconductor device. As an example, the semiconductor device inspecting apparatus 100 may be a probe apparatus for inspecting electrical characteristics of a wafer 10 on which a plurality of integrated circuit chips are formed.

The semiconductor device inspecting apparatus 100 may be configured to include a circuit board 110, an interposer 120, a support 130, and a space transformer 141.

The circuit board 110 may include a printed circuit board (PCB). The circuit board 110 may generally have a disk shape and be coupled to a tester (not shown) at one side thereof. The tester may generate an inspecting signal for an inspecting process of the wafer 10, transfer the generated inspecting signal to the circuit board 110, and judge an inspection result based on a signal received through the inspecting signal. The interposer 120, which is to electrically relay between the circuit board 110 and the space transformer 140, may transfer the inspecting signal generated in the tester to the space transformer 141. The support 130 may serve to support and fix the space transformer 141 onto the circuit board 110.

The space transformer 141 may serve to compensate for a difference value between a circuit pitch of the circuit board 110 and a circuit pitch of the integrated circuit chip. Since a degree of integration of the integrated circuit chip is higher than that of the circuit board 110, the space transformer 141 may have an inspecting circuit designed so as to be in accordance with the integration of the integrated circuit chip. As an example, the space transformer 141 may include a substrate 142, visa 144, electrodes 146, an insulating pattern 148, circuit patterns 151, and connection pins 153.

The substrate 142 may be a base for manufacturing components of the space transformer 141. The substrate 142 may have a flat shape with a first surface 142a and a second surface 142b, which is an opposite surface to the first surface 142a. The first surface 142a may be a surface facing the wafer 10, and the second surface 142b may be a surface facing the circuit board 110 or the interposer 120. An electrode pad 143 electrically connected to the interposer 120 may be formed on the second surface 142b. The substrate 142 may be made of an insulating material such as ceramic, glass, silicon, and the like.

The via 144 may be a metal via penetrating through the substrate 142. One end of the via 144 may be connected to the electrode pad 143, and the other end thereof may be connected to any one of the electrodes 146. In the case in which a plurality of vias 144 are provided, the plurality of vies 144 may be spaced apart from each other by a predetermined interval in the substrate 142 and be disposed in a regular pattern. As an example, the vias 144 may be disposed to form a grid shape. In this case, a plurality of electrode pads 143 may face the vias 144 and be connected to the vias 144 to form a grid shape.

The electrodes 146 may include various kinds of electrodes that are disposed on the substrate 142. As an example, the electrodes 146 may include signal/power electrodes 146a and ground electrodes 146b that are disposed as a single layer on the first surface 142a. The signal/power electrodes 146a, which are circuit electrodes receiving the inspecting signal transferred from the interposer 120, may be connected to the vias 144 on the first surface 142a. The signal/power electrodes 146a may be divided into signal electrodes and power electrodes according to their functions. The ground electrodes 146b may be disposed to be spaced from the signal/power electrodes 146a by a predetermined interval on the first surface 142a. A plurality of ground electrodes 146b may be used as one common electrode. To this end, the electrodes 146 may further include a common ground electrode 146c electrically connecting the vias 144 connected to the ground electrodes 146b in the substrate 142 to each other.

The insulating pattern 148 may cover the first surface 142a so as to protect the electrodes 146. As an example, the insulating pattern 148 may have openings selectively opening the signal/power electrodes 146a and the ground electrodes 146b and be electrically connected to the circuit patterns 151 through the openings. The circuit patterns 151 may be selectively connected to the signal/power electrodes 146a and the ground electrodes 146b through the openings on the insulating pattern 148. Each of the circuit patterns 151 may be provided with the connection pins 153. The connection pins 153 may be pins connected to integrated circuit chips of the wafer 10.

Meanwhile, the signal/power electrodes 146a may be divided into a used electrode 146a' and a non-used electrode 146a''. The used electrode 146a' may be an electrode that performs a function of transferring the inspecting signal to the wafer 10 by the connection pins 153 or has power applied thereto. Therefore, the used electrode 146a' may be connected to the circuit pattern 151 through a region selectively opened by the insulating pattern 148. On the other hand, the non-used electrode 146b'' may be an electrode that does not perform the function of transferring the inspecting signal as described above. Therefore, the non-used electrode 146b'' may be completely covered by the insulating pattern 148, such that it is not exposed.

Similar to that the signal/power electrodes 146a are divided according to whether or not they are used, the ground electrodes 146b may be divided into a used electrode 146b' and a non-used electrode 146b''. The used electrode 146b' may be connected to the circuit pattern 151 through regions selectively opened by the insulating pattern 148, and the non-used electrode 146b'' may also be completely covered by the insulating pattern 148, such that it is not exposed.

The reason why the electrodes 146 are divided into the used electrodes 146a' and 146b' and the non-used electrodes 146a'' and 146b'' according to whether they are used is that only required electrodes are selectively used among the electrodes 146a and 146b in a pre space transformer state before the space transformer 141 is manufactured. That is, the pre space transformer may be a pre structure in which the above-mentioned electrodes 146a and 146b are formed in a predetermined unit, and the space transformer 140 may be a final structure manufactured by forming the circuit patterns 151 and the connection pins 153 electrically connected to the used electrodes 146a' and 146b' of the pre space transformer 140 so as to select the required electrodes among the above-mentioned electrodes 146a and 146b.

Next, a pre space transformer for manufacturing the above-mentioned space transformer 141 will be described in detail. Hereinafter, a description overlapped with that of the above-mentioned space transformer 141 may be omitted or simplified.

FIG. 3 is a cross-sectional view showing a pre space transformer for manufacturing the space transformer shown in FIG. 2; and FIG. 4 is a plan view showing the pre space transformer for manufacturing the space transformer shown in FIG. 2. In addition, FIG. 5 is a cross-sectional view taken along the line I-I' of FIG. 2.

Referring to FIGS. 3 to 5, the pre space transformer 140 according to the exemplary embodiment of the present invention, which is to manufacture the space transformer 141 described above with reference to FIG. 2, may be configured to include a substrate 142, vias 144, electrodes 146, and an insulating film 147.

The electrodes 146 may be divided into individual electrodes and common electrodes. The individual electrodes may include signal/power electrodes 146a and ground electrodes 146b that are disposed so as to be spaced apart from each other on the first surface 142a of the substrate 142. Each of the signal/power electrodes 146a, and the ground electrodes 146b may have substantially an island-shaped transversal cross section. The signal/power electrodes 146a and the ground electrodes 146b may be repeatedly disposed so as to be spaced apart from each other by a predetermined interval to form a grid shape.

Unlike the individual electrodes, the common electrodes may include common ground electrodes 146c having a plate shape so as to have an occupancy area larger than those of the individual electrodes in the substrate 142. The common ground electrodes 146c, which are the common electrodes, may connect a plurality of connection pins 153 to one around electrode. Therefore, the signal/power electrodes 146a may be disposed so as to have high density while having a relatively small occupancy area, and the common ground electrodes 146c may be provided in one plate form while having a relatively large occupancy area.

The insulating film 147 may be a film covering the individual electrodes among the electrodes 146 to protect the individual electrodes from an external environment. As the insulating film 147, various films made of an insulating material may be used. For example, as the insulating film 147, a film made of a polyimide material may be used. The insulating pattern 148 as described above may be formed by performing a predetermined patterning process on the insulating film 147. Although the case in which the insulating film 147 covers only the first surface 142a of the substrate 142 has been described by way of example in the present embodiment, the insulating film 147 may also be formed to cover the second surface 142b. That is, the insulating film 147 may be formed to cover at least any one of the first surface 142a and the second surface 142b.

Meanwhile, the electrodes 146 may be repeatedly disposed as one unit pattern a. As an example, the unit pattern a may have a form in which it includes one signal/power electrode 146a and one ground electrode 146b among the electrodes 146 disposed on the first surface 142a. The unit pattern a may be repeatedly disposed to form the above-mentioned grid shape. Although the case in which the unit pattern a includes one signal/power electrode 146a and one ground electrode 146b among the electrodes 146 disposed on the first surface 142a has been described by way of example in the present embodiment, the unit pattern is not limited to the above-mentioned unit pattern a, but may be variously modified and altered.

The pre space transformer 140 having the above-mentioned structure may have a structure in which all of the electrodes 146 are disposed on the same plane of the substrate 142. Particularly, the pre space transformer 140 may have a structure in which the signal/power electrodes 146a and the ground electrodes 146b among the electrodes 146 are disposed on the same plane of the substrate 142. In this case, the structure of the electrodes as described above may be designed as a structure of a single electrode layer rather than a structure of two electrode layers in which the electrodes are disposed on different planes of the substrate 142. In addition, the pre space transformer 140 may have a structure in which a plurality of ground electrodes 146b that may be used as the common electrodes among the electrodes 146 are electrically connected to the common ground electrodes 146c inserted into the substrate 142.

In the pre space transformer 140 having the above-mentioned structure, the electrodes 146 configuring the unit pattern a may be repeatedly disposed on the substrate 142 and be protected in which they are covered by the insulating film 147. In this case, the insulating film 147 is patterned so as to use only required electrodes among the electrodes 146 so as to correspond to integrated circuit chips of which a final design is subsequently completed and circuit patterns 151 and connection pins 153 are formed with respect to opened electrodes, thereby making it possible to manufacture the space transformer 141 as shown in FIG. 2.

As described above, the pre space transformer 140 according to the exemplary embodiment of the present invention may have a structure of a single electrode layer in which the electrodes 146 are disposed on the same plane of the substrate 142. In this case, the pre space transformer 140 may have a structure in which required patterns are disposed only on the first surface of the substrate rather than a structure in which various pads and patterns for forming connection pins are formed on the first surface of the substrate and a land grid array (LGA) and various patterns are formed on the second surface of the substrate. Therefore, the pre space transformer and the space transformer manufactured using the pre space transformer according to the exemplary embodiment of the present invention have a structure in which the electrodes are disposed on the same plane of the substrate, such that an electrode structure is further simplified as compared with a structure in which the electrodes are disposed on different planes of the substrate, thereby making it possible to improve manufacturing efficiency.

In addition, in the pre space transformer 140 according to the exemplary embodiment of the present invention, the electrodes 146 configuring a predetermined unit pattern may be repeatedly disposed on the substrate 142 and be covered by the insulating film 147 to thereby be protected. In this case, since the pre space transformer 140 may be manufactured in advance and only the electrodes 146 required for finally designed integrated circuit chips may be then selected to correspond to the finally designed integrated circuit chips rather than that the space transformer starts to be manufactured after a design of integrated circuit chips that become electrical inspection targets is finally completed according to the related art, a manufacturing period of the space transformer 141 may be decreased. Accordingly, the pre space transformer and the space transformer manufactured using the pre space transformer according to the exemplary embodiment of the present invention have a structure in which the electrodes capable of corresponding to expected pitches are disposed on the substrate so as to form a predetermined unit pattern and are covered by the insulating film before the design of the integrated circuit chips is completed. Therefore, since the pre space transformer may select only the required electrodes among the electrodes so as to correspond to the integrated circuit chips of which the final design is subsequently completed to manufacture the space transformer, it may significantly decrease the manufacturing period of the space transformer and cope with various models of integrated circuit chips.

In addition, as described above, the semiconductor device inspecting apparatus is manufactured using the space transformer manufactured using the pre space transformer that may be applied to the various models, such that manufacturing efficiency of the semiconductor device inspecting apparatus may be increased.

The present invention has been described in connection with what is presently considered to be practical exemplary embodiments. In addition, the above-mentioned description discloses only the exemplary embodiments of the present invention. Therefore, it is to be appreciated that modifications and alterations may be made by those skilled in the art without departing from the scope of the present invention disclosed in the present specification and an equivalent thereof. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A pre space transformer comprising:
   a substrate having a first surface and a second surface, which is an opposite surface to the first surface;
   individual electrodes disposed on the first surface; and
   a common electrode disposed in the substrate,
   wherein the individual electrodes are repeatedly disposed while configuring a unit pattern,
   the unit pattern is provided in a grid shape in which one signal/power electrode and one ground electrode are disposed to be spaced apart from each other, and
   the common electrode includes a common ground electrode and connects the first and second surfaces by penetrating straight-through the substrate portions between the common ground electrode and the first and second surfaces.

2. The pre space transformer according to claim 1, wherein the individual electrodes include signal/power electrodes and ground electrodes, and
   the common electrode includes common ground electrodes electrically connected to the ground electrodes.

3. The pre space transformer according to claim 1, wherein the individual electrodes include signal/power electrodes and ground electrodes having an island-shaped transversal cross section, and
   the common electrodes include common ground electrodes having a plate shape.

4. The pre space transformer according to claim 1, further comprising a protective film covering at least one of the first surface and the second surface.

5. The pre space transformer according to claim 1, further comprising a plurality of vias penetrating through the substrate,
   wherein the vias are disposed to form a grid shape.

6. The pre space transformer according to claim 1, further comprising a plurality of vias penetrating through the substrate; and
   electrode pads connected to the vias on the second surface.

* * * * *